(12) United States Patent
Van Zyl et al.

(10) Patent No.: US 7,839,223 B2
(45) Date of Patent: Nov. 23, 2010

(54) METHOD AND APPARATUS FOR ADVANCED FREQUENCY TUNING

(75) Inventors: Gideon Van Zyl, Fort Collins, CO (US); Jeff Roberg, Longmont, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 297 days.

(21) Appl. No.: 12/242,328

(22) Filed: Sep. 30, 2008

(65) Prior Publication Data

US 2009/0237170 A1    Sep. 24, 2009

Related U.S. Application Data

(60) Provisional application No. 61/038,774, filed on Mar. 23, 2008.

(51) Int. Cl.
*H03L 7/00* (2006.01)
*H05B 7/18* (2006.01)
*H05H 1/24* (2006.01)

(52) U.S. Cl. .................... 331/35; 315/111.21
(58) Field of Classification Search .......... 331/1 R, 331/34, 35, 126, 127; 315/111.21
See application file for complete search history.

(56) References Cited

U.S. PATENT DOCUMENTS

| | | | |
|---|---|---|---|
| 5,543,689 A | * | 8/1996 | Ohta et al. ............ 315/111.21 |
| 6,707,255 B2 | | 3/2004 | Coumou et al. |
| 6,902,646 B2 | | 6/2005 | Mahoney et al. |
| 7,145,398 B2 | * | 12/2006 | Dalton et al. ............. 331/1 A |
| 7,476,233 B1 | * | 1/2009 | Wiener et al. ............. 606/169 |

FOREIGN PATENT DOCUMENTS

| | | |
|---|---|---|
| JP | 02884056 B2 | 4/1999 |
| JP | 2006-054148 | 2/2006 |

OTHER PUBLICATIONS

Jung, Jong Han, "International Search Report re Application No. PCT/US09/037001", Oct. 16, 2009, Published in: PCT.

* cited by examiner

*Primary Examiner*—David Mis
(74) *Attorney, Agent, or Firm*—Neugeboren O'Dowd PC; Sean R. O'Dowd

(57) ABSTRACT

A method and apparatus for tuning the operational frequency of an electrical generator coupled to a time-varying load is described. One illustrative embodiment rapidly calculates an error (reflection coefficient magnitude) at the current operational frequency of the electrical generator; adjusts the frequency of the electrical generator by an initial step size so; rapidly calculates a second error; and if the magnitude of the second error is smaller than the magnitude of the first error, then the step size is increased and the frequency is adjusted by the increased step size.

16 Claims, 12 Drawing Sheets

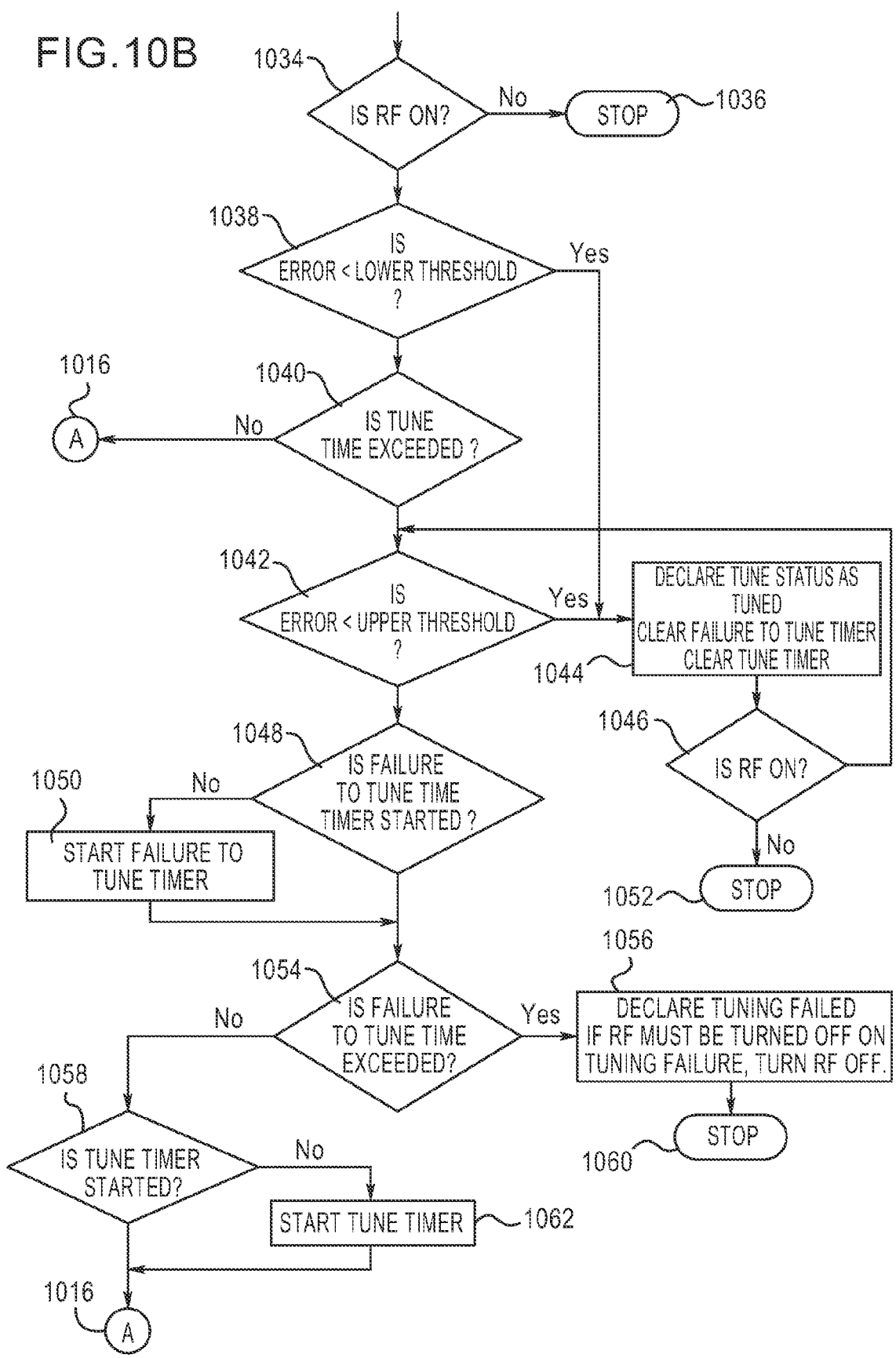

US 7,839,223 B2

METHOD AND APPARATUS FOR ADVANCED FREQUENCY TUNING

RELATED APPLICATION

This application claims the benefit of priority of U.S. provisional application Ser. No. 61,038,774 entitled "Advanced Frequency Tuning," filed on Mar. 23, 2008, which is incorporated by reference in its entirety herein.

FIELD OF THE INVENTION

The present invention relates generally to electrical generators. In particular, but not by way of limitation, the present invention relates to methods and apparatuses for tuning (adjusting) the operational frequency of a generator.

BACKGROUND OF THE INVENTION

Power generators are typically designed for optimal performance into a specific load impedance, typically 50 ohms. Operating into a load impedance close to the design value typically results in the highest output power capability and the lowest stress on the components internal to the generator. Typically, but not always, some type of matching network is used to match the load to the generator. By correct design of the matching network (either internal to the generator or external), it is possible to transform the impedance of the load to a value close to the desired load impedance at some frequency in the range of frequencies that the generator can produce.

SUMMARY OF THE INVENTION

Illustrative embodiments of the present invention are shown in the drawings and summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

Many embodiments of the present invention provide a method and apparatus for rapidly tuning the operational frequency of a generator (e.g., an RF generator) in response to changes in load impedance of a nonlinear and/or time-varying load coupled to the generator.

One illustrative embodiment comprises a method of frequency tuning, the method including calculating the load reflection coefficient and then adjusting the generator's operating frequency based on the relative magnitude of the calculated load reflection coefficient as compared with one or more previously calculated load reflection coefficients.

Another illustrative embodiment comprises a method of frequency tuning, the method including calculating the load reflection coefficient and then adjusting a frequency step size based on the relative magnitude of the calculated load reflection coefficient as compared with one or more previously calculated load reflection coefficients.

Yet another illustrative embodiment comprises a method of calculating the load reflection coefficient (or other metric) in a rapid time frame relative to the variability of a time-variant load coupled to a generator.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

DETAILED DESCRIPTION

Figure 1:
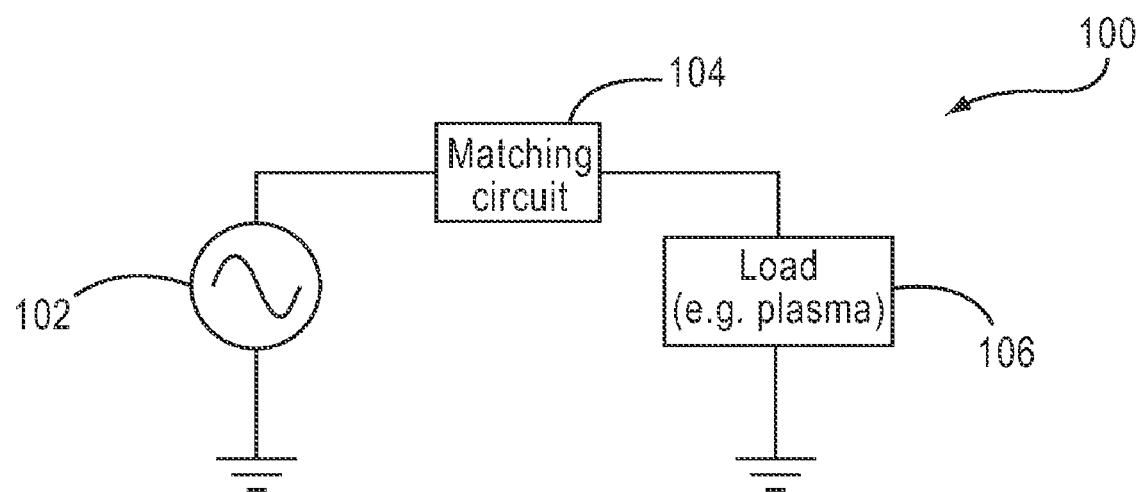
FIG. 1 is a system-level block diagram depicting a system in which embodiments of the present invention may be realized.

Reference is now directed to the drawings, where like or similar elements are designated with identical reference numerals throughout the several views.

Frequency tuning in generators (e.g., RF generators) is often used to reduce reflected power and thereby obtain efficient operation. Referring to FIG. 1, a block diagram of a typical generation system 100 is shown. A generator 102 is electrically coupled to a load 106. Typically, but not always, some type of matching network 104 is used to match the load to the generator. By correct design of the matching network (either internal to the generator, or external as shown in FIG. 1), it is possible to transform the impedance of the load to a value close to the desired load impedance of the generator (either at the output connector, typically 50Ω, or at the active devices internal to the generator, which is typically some low complex impedance like 8+j3Ω) at some frequency in the range of frequencies that the generator can produce.

The measure of how close the load impedance is to the desired impedance can take many forms, but typically it is expressed as a reflection coefficient $$\rho = \frac{Z - Z_0}{Z + Z_0^*}$$

where $\rho$ is the reflection coefficient of the impedance Z with respect to the desired impedance $Z_0$. The magnitude of the reflection coefficient ($|\rho|$) is a very convenient way to express how close the impedance Z is to the desired impedance $Z_0$. Both Z and $Z_0$ are in general complex numbers.

Frequency tuning methods and algorithms try to find the optimal or desirable frequency of operation. A point of optimization may be defined as the frequency where the magnitude of the reflection coefficient with respect to the desired impedance is the smallest, but other measures may be used for this purpose. Such other measures, for example, include minimum reflected power or maximum delivered power.

On a time-invariant linear load, many tuning methods will work well. But on time-varying and/or nonlinear loads, it has been found that special techniques are required to ensure reliable operation of the tuning algorithms. As changes in load impedances occur (e.g., as a result of a change in power delivered to the load, gas chemistry, pressure etc.), there is often a need to dynamically tune the generator to operate at the frequency that presently corresponds to a desired (e.g., optimal) frequency, in a time frame that corresponds to the dynamics of the time-varying and/or nonlinear load to which the generator is coupled.

In the context of a control problem, it is useful to view an error as the indication of an undesirable (e.g., non-optimal) operational state. In classical control theory, it is theoretically possible to drive an error to zero, but this is rarely the case in frequency tuning methodologies.

Assuming that a desirable frequency of operation is a frequency at which the magnitude of the load reflection coefficient is at or substantially close to its minimum, it is noted that the relationship between the controlled variable (frequency) and the error is not necessarily monotonic. Furthermore, the optimum point of operation is at a point where the gain (defined as change in error divided by change in frequency) is zero.

Figure 2:
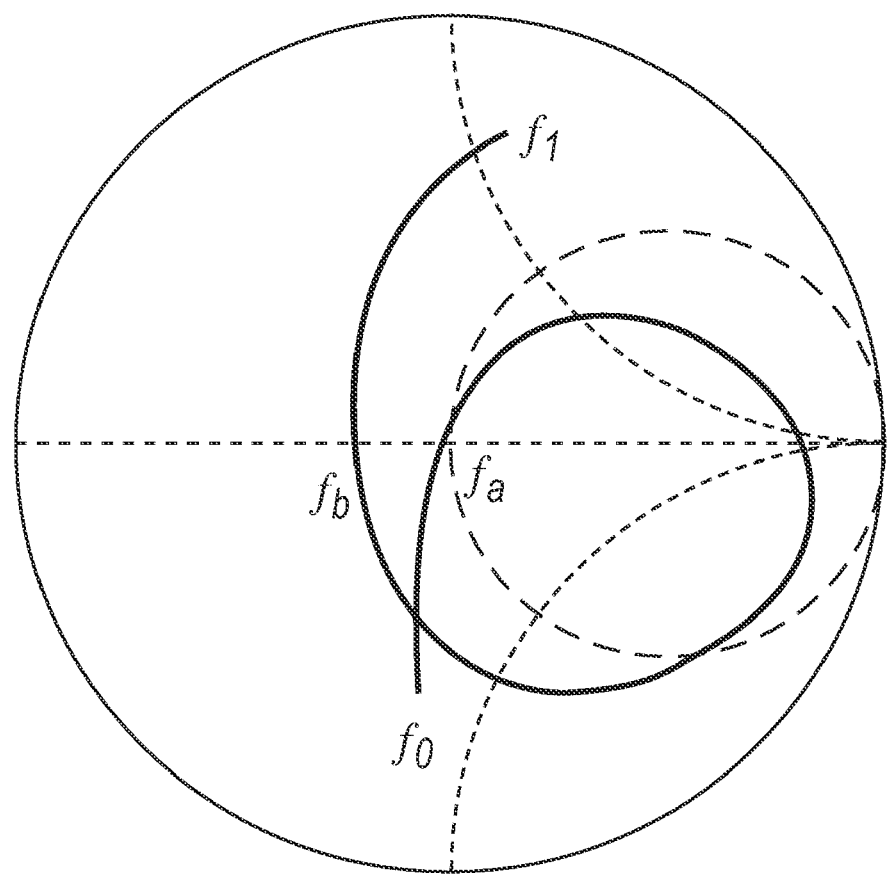
FIG. 2 is a graphical illustration (Smith chart) of the general behavior of the load reflection coefficient as a function of frequency for the system depicted in FIG. 1.
Figure 3:
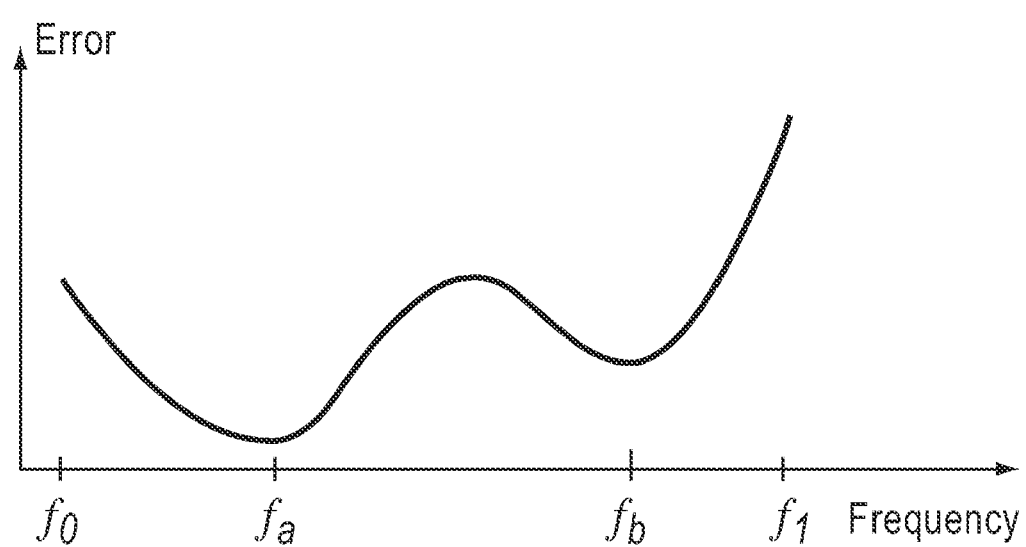
FIG. 3 is a graphical illustration of an error (here simply the reflection coefficient magnitude) as a function of frequency corresponding to FIG. 2.

To add to the challenges, it is also possible that local minima may exist in an area which a control method can get trapped. By way of illustrative example, FIG. 2 shows a plot of a load reflection coefficient on a load reflection coefficient chart (Smith chart), and FIG. 3 shows the corresponding magnitude of the load reflection coefficient used as the error, as a function of frequency.

In some special cases, where a priori information about the load is known, it is possible to arrange for an error function to be a monotonic function of frequency, so that a simple linear controller may be used. For example, such a system is disclosed in U.S. Pat. No. 6,472,822, entitled "Pulsed RF Power Delivery for Plasma Processing," issued to Chen et al., on Oct. 29, 2002.

Figure 5:
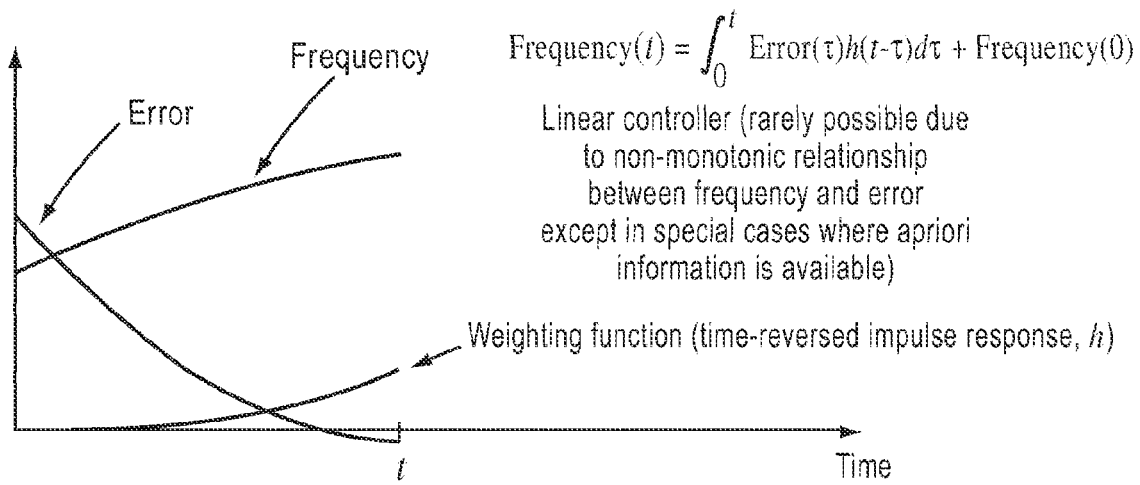
FIG. 5 is a graphical illustration of the error and frequency as a function of time in the case where an error is a monotonic function of frequency.
Figure 6:
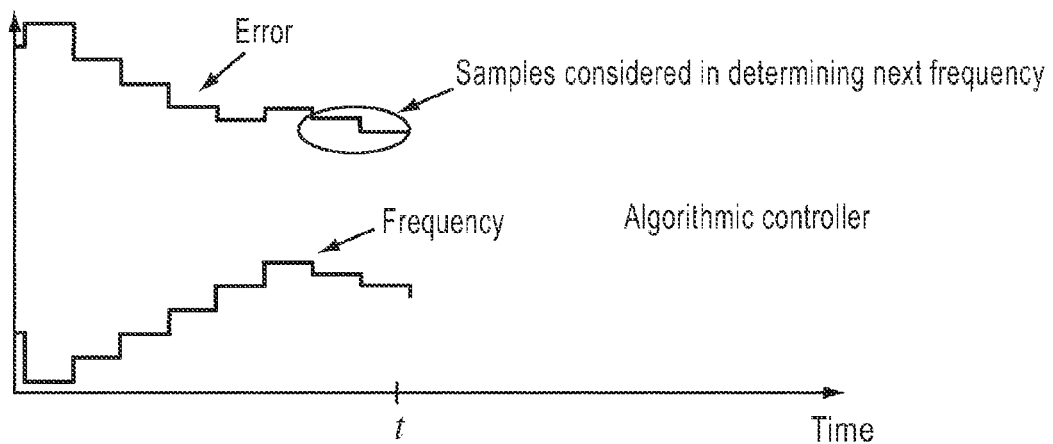
FIG. 6 is a graphical illustration of an error and frequency as a function of time for the case where methods in accordance with embodiments of the present invention are beneficial.

Referring to FIG. 5, it is a graph depicting an error and frequency that are both monotonic. Such linear control is rarely applicable due to the non-monotonic relationship between frequency and error, except in those special cases where a priori information about the load is available.

It has been found that two common problems with plasma loads are: (1) the nonlinear nature of the load because the plasma load impedance is a function of power level; and (2) the load impedance changes over time because of changing chemistry, pressure, temperature and other physical characteristics of the non-linear plasma load. Another problem that is unique to plasma (or plasma-like) loads is that the plasma can extinguish if the delivered power to the plasma falls below a minimum value for a long enough time. Thus a frequency where insufficient power is delivered to the plasma load can not be applied for very long, or the plasma will extinguish.

Figure 7:
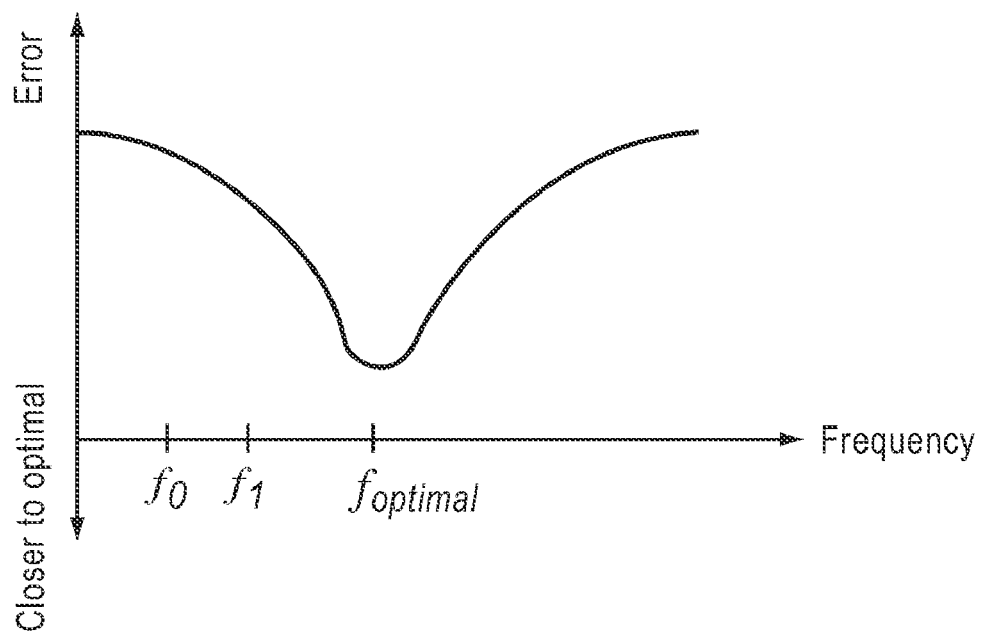
FIG. 7 is a graphical illustration of an error function as a function of frequency for a time-invariant (linear or nonlinear) load.
Figure 8:
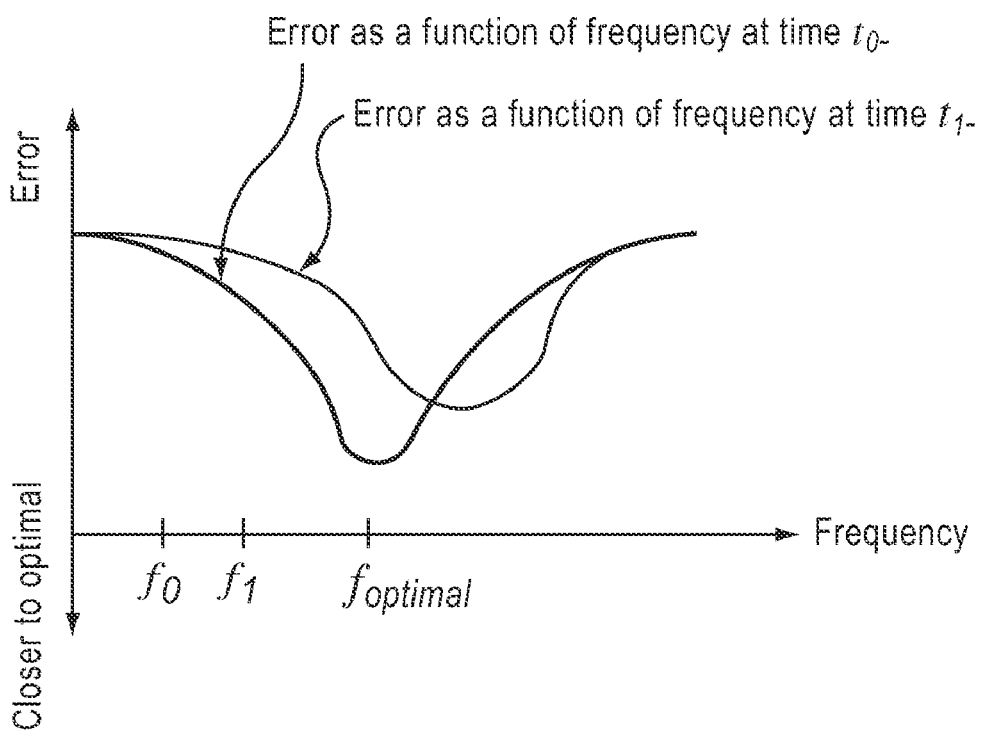
FIG. 8 is a graphical illustration of another error function as a function of frequency for a time-varying (linear or nonlinear) load.

If a plasma load changes with time, known tuning techniques are often unsatisfactory and problematic as FIGS. 7 and 8 help to illustrate. Referring to FIG. 7 for example, an error, e.g., the magnitude of the load reflection coefficient, as a function of frequency, is assumed to remain fixed. In this situation, a frequency tuning algorithm operating at frequency $f_0$ and time $t_0$ and subsequently at frequency $f_1$ at time $t_1$ will correctly determine that $f_1$ is a better frequency at which to operate, and will continue to tune to higher frequencies until the minimum error at $f_{optimal}$ is reached.

In FIG. 8, however, an error, e.g., the magnitude of the load reflection coefficient, as a function of frequency, changes over time. In this situation, a typical frequency tuning algorithm operating at frequency $f_0$ and time $t_0$ and subsequently at frequency $f_1$ at time $t_1$ will incorrectly determine that $f_1$ is a worse frequency at which to operate and will tune away from the optimal frequency. This incorrect result is because the error function itself has changed over time.

Moreover, when the power (e.g., RF power) to the load is pulsed, frequency tuning becomes even more problematic. Due to the nonlinear nature of the load and the relatively high quality factor (ratio of stored energy to energy delivered per cycle (e.g., RF cycle), often denoted by "Q") that impedance matching networks employ, the load impedance changes very rapidly during the first few microseconds of the applied pulse (e.g., RF pulse).

Figure 4:
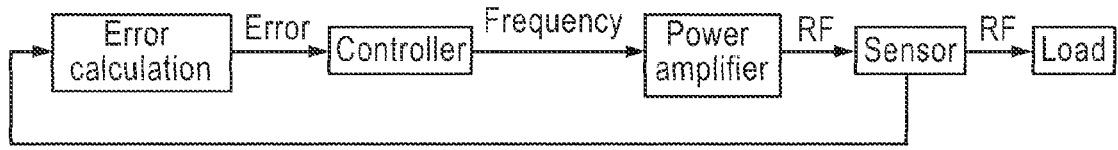
FIG. 4 is a block diagram depicting functional components that may be implemented in connection with the system depicted in FIG. 1.

Referring first to FIG. 4, it is a block diagram depicting functional components of exemplary embodiments, which may be implemented in connection with the embodiment depicted in FIG. 1. It should be recognized that the illustrated arrangement of these components is logical and not meant to be an actual hardware diagram. Thus, the components can be combined or further separated in an actual implementation. Moreover, the construction of each individual component, which may include hardware, firmware, software, and combinations thereof, is well-known to those of skill in the art—in light if this specification.

Several variations of the controller depicted in FIG. 4 are configured to accommodate (e.g., by carrying out control methodologies described further herein) circumstances in which a non-monotonic relationship between an error and the frequency exist (e.g., when a priori information about the load is not known). And the error function depicted in FIG. 4 in many variations indicates non-desirable operation, and in many embodiments indicates non-optimal operation.

Several embodiments of the present invention address the speed required to keep up with a time-varying load. In many embodiments, the solution is two-fold. The first is the development of a very fast division methodology that allows the calculation of the load reflection coefficient at speeds significantly faster (up to one thousand times faster) than what is traditionally used. The second part of the solution in these embodiments is to allow the frequency step size to increase if the error is decreasing step-over-step, and decrease (or stay constant) if the error is increasing step-over-step. Taken together, the problem of keeping up with a time-varying load is solved. It is certainly contemplated, however, that alternatives to the specific fast division methodology disclosed herein may be utilized (if sufficiently fast) in connection with the above-identified second part of the solution.

Figure 9:
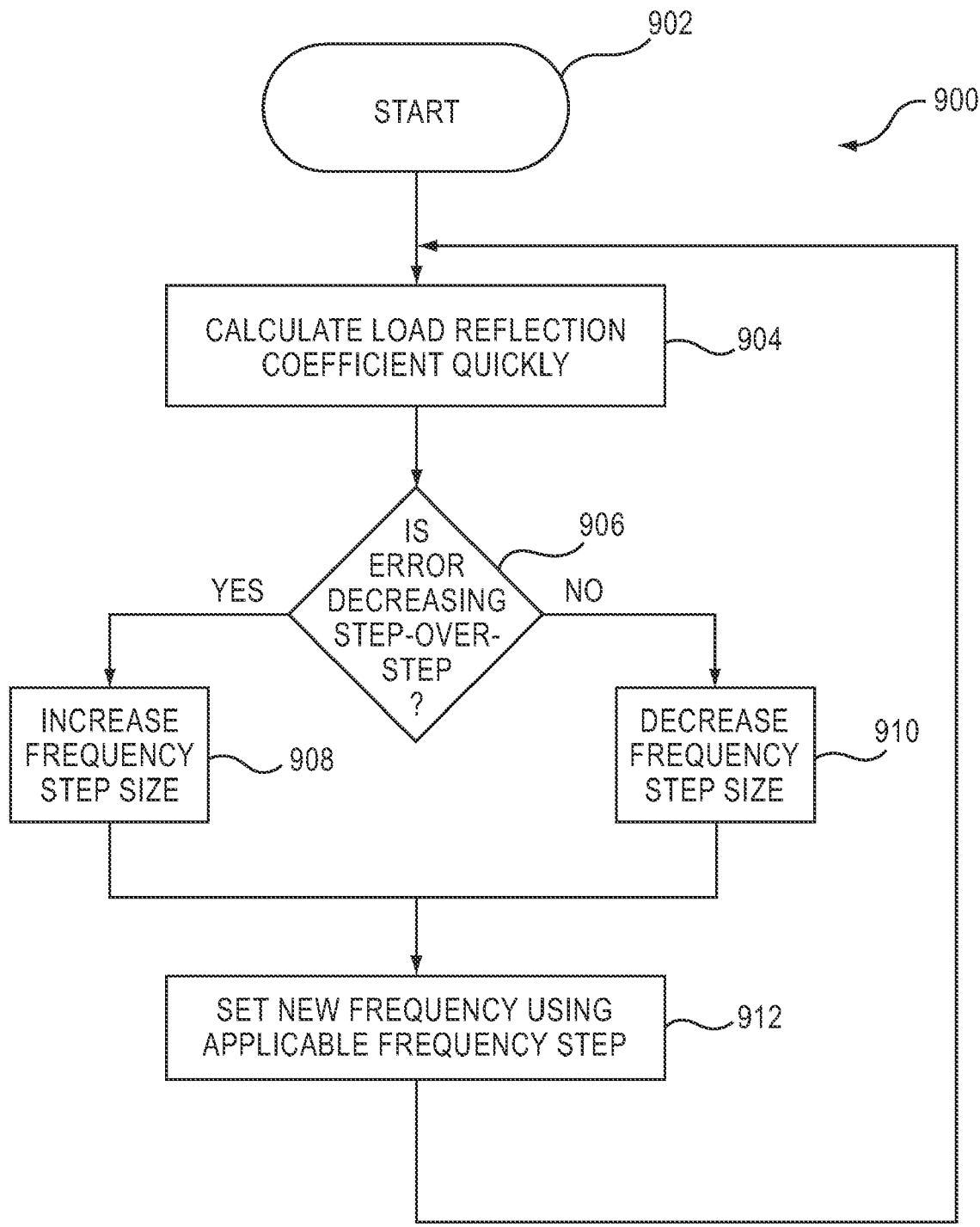
FIG. 9 is a flowchart of a method for finding a desirable frequency in accordance with yet another illustrative embodiment of the disclosed frequency tuning method.

FIG. 9 depicts a flow diagram 900 illustrating one embodiment of a frequency tuning method in accordance with the present invention, which may be carried out, at least in part, by the controller depicted in FIG. 4. The method initiates at block 902, typically, but not always, at power up. Next, at block 904, the method rapidly calculates the load reflection coefficient (e.g., using a very fast division method that allows the calculation of the load reflection coefficient at speeds significantly faster (e.g., up to one thousand times faster) than what is traditionally used). Calculation in this context may be in the order of microseconds (depending on the specific implementation), which is rapid relative to the rate at which the load varies in time, typically in the order of milliseconds. Although a specific method for arriving at the load reflection coefficient is described in detail herein, other methodologies for calculating the load reflection coefficient are certainly contemplated.

At branch 906 the method determines whether the error is decreasing relative to the previous error (or errors) calculated. One skilled in the art will readily appreciate that alternative approaches (e.g., ensemble averaging) to comparing the current calculated error relative to previously calculated errors are within the scope of this embodiment. If the current error is decreasing relative to the previous calculated error (or errors), then the frequency step size (by which the frequency is adjusted) is increased, as reflected in block 908. If, on the other hand, the current error is not decreasing relative to the previous calculated error (or errors), then the method branches to block 910, where the frequency step size is decreased or (left at the present value). Finally, the method progresses to block 912, where the new frequency is set (based on the applicable step size) and the method cycles through again.

The rapid division method disclosed herein makes use of the fact that the reflection coefficient is a complex number with magnitude between 0 and 1. Treating the real and imaginary parts of the reflection coefficient separately, and determining the sign of the result from the signs of the numerator and denominator, or when only calculating the magnitude of the reflection coefficient (or, more typically the square of the magnitude of the reflection coefficient by dividing reflected power by forward power), the problem is reduced to the calculation of the ratio of two positive real numbers. When it is known that the answer must be between 0 and 1, it allows for an iterative solution without ever having to perform multiplication operations. Note that in the specific application, it can be assumed that the denominator is never zero because the denominator is generally proportional to the square root of forward power, which is never zero during operation, when this calculation is required.

The fast division method can be understood by noting that R=N/D, where R is the ratio to be calculated, N is the numerator, and D the denominator. R, the ratio to be calculated, is the same as N=R×D. The calculation is performed in fixed point arithmetic, and therefore we assign a power of 2, for example $2^n$, to represent a ratio of one. With this assignment, we have $$2^n \times N = R \times D$$

where N, R and D are integers. The calculation of $2^n \times N$ can be performed inexpensively (in terms of computing resources) as a left-shift operation on the binary representation of N.

The calculation starts by calculating low, middle and upper estimates of what R is. The initial low estimate is simply 0, the initial upper estimate, $2^n$, represents a ratio of 1 and the initial middle estimate is $2^{(n-1)}$. At the same time low, middle and high estimates of the product, R×D are calculated as 0, $2^{(n-1)} \times D$ and $2^n \times D$, respectively. Note that the middle and upper estimates for the product can again be calculated efficiently as left shifts of the binary representations of D by n−1 and n, respectively.

The calculation iterates by comparing the middle estimate of the product to the required value, $2^n \times N$. If the middle estimate is greater than $2^n \times N$, then the middle estimate becomes the new upper estimate; otherwise the middle estimate becomes the new low estimate. A new middle estimate is calculated as half the sum of the new low and upper estimates. This calculation is performed as a sum followed by a right shift, again using computationally non-intensive numerical processing techniques. By maintaining extra fractional bits, rounding errors can be avoided.

After n iterations, the calculation is complete as the difference between the upper and lower estimates collapse until they are separated by 1 in fixed point arithmetic. The middle estimate can then be used to select the lower or upper estimate, which ever is closer.

One skilled in the art will appreciate that the fast division method disclosed herein may be implemented in numerous manners, including without limitation, hardware, firmware and software.

Using this high speed, computationally-efficient division method, the reflection coefficient (or its magnitude) is available for use by the frequency tuning method with sufficient accuracy and within a fraction of a microsecond after the new values for the forward and reflected signals are available, allowing for very fast tuning. For example, when using 8-bit estimates of the ratio, and a 64 MHz clock, the ratio is calculated in 125 nanoseconds. Typically the noisy nature of the plasma load limits the maximum frequency update rate to a few microseconds, so this method efficiently provides the required calculation in adequate time to deliver a fast and effective frequency tuning capability.

Many variations of the inventive frequency tuning methodologies carried out in connection with several embodiments deviate from the traditional step-halving algorithms in use in that the methodologies allow the frequency step to increase when it is going in the desired direction (detected by a decreasing error). This feature allows these methods to follow time-varying loads much more accurately. Although these methods may be prone to instability, stability may be enhanced by allowing the step size to increase after a fixed number of steps after a change in direction (typically 2 to 4 depending in a complex way on the step-up and step-down gains discussed infra). This instability, however, takes the form of a limit cycle, and eliminating this limit cycle is not necessary for correct operation of the tuning method itself. Noise considerations relative to stabilizing the frequency tuning methodologies are discussed infra.

To facilitate further description of frequency tuning method methodologies described herein, the following variables are defined:

$f_{start}$ is the start frequency; $f_{min}$ is the minimum frequency; $f_{max}$ is the maximum frequency; $f_{step_{min}}$ is the minimum frequency step size; $f_{step_{max}}$ is the maximum frequency step size; $g_u$ is the step-up gain; $g_d$ is the step-down gain; $f_{step_{start}}$ is the starting frequency step; $f_{step}$ is the frequency step; $e_0$ is the previous error; and e is the current error.

Figure 10A:
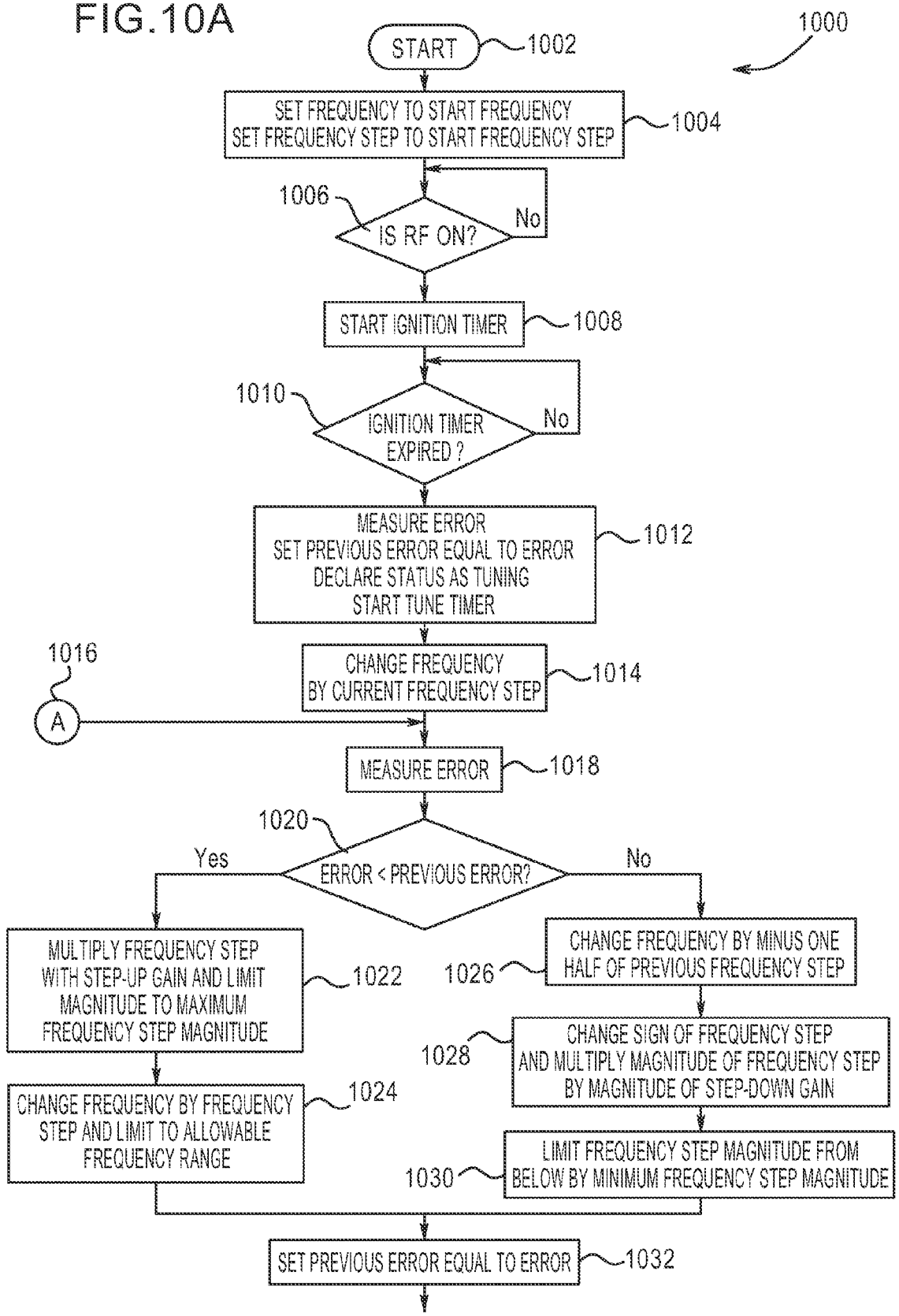
FIG. 10 is a flowchart of a method for finding a desirable frequency in accordance with yet another illustrative embodiment of the disclosed frequency tuning method.

FIG. 10 depicts a flow diagram 1000 illustrating another variation of the disclosed frequency tuning methodology. At block 1002 the method starts at initial power up of the generator system 100, or if frequency tuning is enabled. At block 1004, the method sets the frequency to $f_{start}$ and the frequency step to $f_{step_{start}}$. At block 1006 the method waits until RF is turned on.

On plasma systems it is often necessary to delay the start of the frequency tuning method until the plasma is ignited. One of many possible implementations of this type of delay is shown in blocks 1008 and 1010. At block 1012 the method measures the error and assigns the measured error to the previous error, $e_0$, and starts the tune timer. Next, at block 1014, the current frequency is changed by the starting frequency step $f_{step_{start}}$. The error at the new frequency is measured at block 1018. At block 1020, the error, e, is compared to the previous error, $e_0$.

If the error, e, is less than or equal to the previous error, $e_0$, as determined in block 1020, then the method progresses to block 1022 where the frequency step, $f_{step}$, is multiplied by the step-up gain, $g_u$. If the magnitude of the frequency step is bigger than the maximum frequency step size, $f_{step_{max}}$, then at block 1022 the frequency step magnitude is changed to the maximum frequency step, $f_{step_{max}}$. At block 1024 the frequency is changed by the frequency step, $f_{step}$, and limited to the range between the minimum frequency and the maximum frequency $[f_{min}, f_{max}]$.

If the error, e, is greater than the previous error, $e_0$, as determined in block 1020 then the method progresses to block 1026 where the frequency is changed by minus one-half the current step size, i.e., one-half of the last step is undone. At block 1028 the frequency step, $f_{step}$, is multiplied by negative $g_d$. At block 1030, if the magnitude of the frequency step is less than the minimum frequency step size, $fstep_{min}$, then the frequency step magnitude is changed to the minimum frequency step size, $fstep_{min}$.

At block 1032 the previous error, $e_0$, gets assigned the value of the current error, e. At blocks 1034 and 1036 the case where RF is turned off while tuning is in progress is handled. At block 1038 the error is compared to a lower threshold. If the error is less than the threshold, the method enters the loop created by blocks 1042, 1044, 1046 and 1052 and will remain in this state until the error exceeds an upper threshold as detected in block 1042 or RF is turned off as detected in block 1046. If, on the other hand, the error is larger than the lower threshold as determined in block 1038, the method proceeds to block 1040 where a determination is made as to whether or not a tune time is exceeded. If the tune time is not exceeded, the generator is allowed to operate at the new frequency until a new measurement of the error e is obtained as shown in block 1018. The time that is spent at the new frequency is a function of the load and measurement system characteristics, but is generally on the order of 10 microseconds.

If the tune time is exceeded as determined in block 1040, a determination of whether the error is less than an upper threshold is made in block 1042. If the error is less than the upper threshold the method enters the loop created by blocks 1042, 1044, 1046 and 1052 and will remain in this state until the error exceeds an upper threshold as detected in block 1042 or RF is turned off as detected in block 1046. If the tune time has been exceeded and the error is larger than the upper threshold as determined in block 1042, a failure to tune timer is started and the method is allowed to continue trying to tune to the upper threshold until this failure to tune time is exceeded as determined in block 1054. If the method failed to tune, an error is declared and RF may be turned off depending on the user settings.

The exemplary method depicted in FIG. 10 is augmented by conditions for starting and stopping the tuning method. For example, as illustrated at branches 1038 and 1042, a lower and upper target for the error, as well as a time to get to the lower target, are typically set. The tuning method will then attempt to get to the lower target in the allotted time. If it reaches the lower target the method stops, as illustrated at block 1038. If the allotted time is exceeded, the method stops if the error is less than the upper target, as illustrated at block 1042. Once the method is stopped, it is generally re-started when the upper target is exceeded. If the method fails to reach the upper or lower targets, errors and warnings may be issued to the system controller.

The method can be further augmented by doing an initial frequency sweep when power (e.g., RF power) is first turned on to find the optimal operating point with some degree of accuracy before starting the frequency tuning method. The sweep is generally carried out in both directions because the effects of ignition, or failure to ignite, may mask the true minimum. For example, the plasma may ignite at one frequency, but once ignited, the plasma may operate at a different, higher optimum frequency. If the frequency is swept from low to high, the optimum frequency will be found, but not if it is swept from high to low, since the plasma will not be ignited when the higher, optimal frequency is probed.

Further enhancements include searching for the desirable ignition frequency separately from searching for a desirable operating frequency. Sometimes the desirable ignition frequency corresponds to the frequency at which the load reflection coefficient is minimized with the plasma not ignited. A sweep at very low power where the plasma cannot ignite can determine the best ignition frequency under such conditions, which often occur.

Further enhancements include waypoints for specific systems and processes. Such waypoints may include a start frequency for ignition, a time to stay at the ignition frequency, then a second frequency with a time to stay at that frequency (and even more frequency, duration points) before starting the regular frequency tuning method. Instead of using a frequency and duration for ignition, ignition may also be detected by looking for a sudden change in load reflection coefficient, delivered, forward or reflected power, or combinations thereof.

In connection with many variations of the inventive tuning methodologies described herein, a step down gain, $g_d$, may be generally less than 0.5 for stability reasons, with 0.125 being an exemplary value. The step up gain, $g_u$ is generally set to 2 or 4. The minimum frequency is generally set large enough so that when comparing two frequencies, the error is significantly different, and noise does not influence the decision process in the method too much. Correctly setting the smallest frequency step helps to optimize the method. The maximum frequency step is generally set such that the method does not jump over minima or extinguish (in the case of plasma loads) the plasma. The variables are generally preset, but the user may have the ability to change the settings to optimize the method in specific applications.

One solution for simultaneous pulsing and frequency tuning discards information at the start of the pulse while the impedance is still rapidly changing and effectively controls by using only information once the load impedance is stable.

This approach avoids the need for tuning within the pulse, but manages to obtain a good average frequency of operation.

To avoid aliasing affects, the measurement and control may be synchronized with the rising edge of the pulse. By delaying the start of the measurement and control cycle from the start of the pulse, reasonable operation on plasma-type loads is possible. Typically discarding the first 10 microseconds after the start of the pulse is sufficient to achieve reasonable results.

Figure 11:
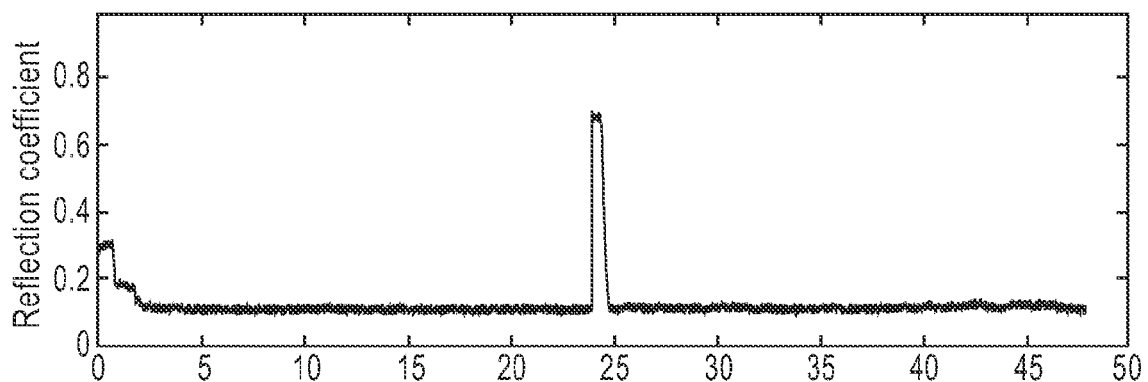
FIGS. 11 and 12 are graphs depicting a simulation of exemplary methods carried out in connection with embodiments exposed to noise.
Figure 12:
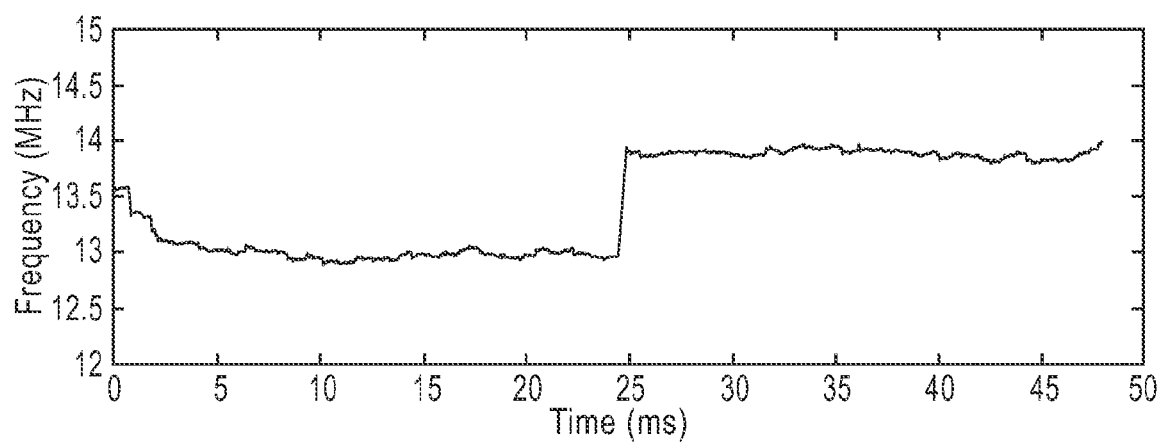

FIGS. 11 and 12, viewed together, illustrate a simulation of the disclosed frequency tuning methodology in the presence of noise. In this illustration, the ideal frequency (where the error is at its minimum) is 13 MHz for the first 24 milliseconds, after which the ideal frequency changes to 14 MHz. The time spent at each frequency in the simulation is 16 microseconds.

Figure 13:
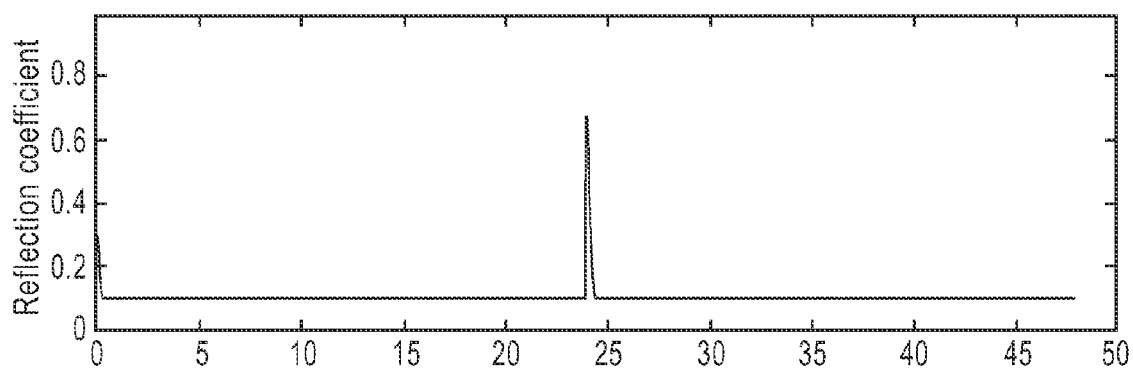
FIGS. 13 and 14 are graphs depicting a simulation of exemplary methods carried out in connection with embodiments in the absence of noise.
Figure 14:
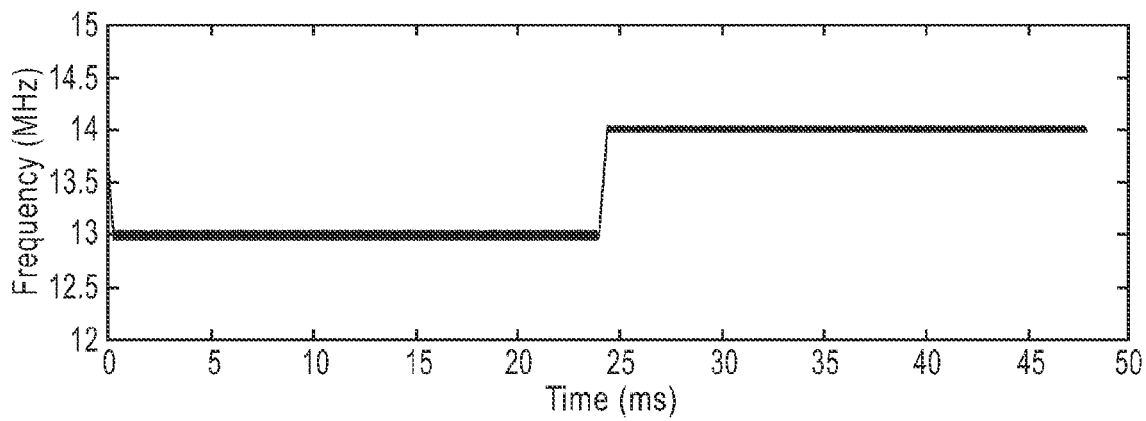

FIGS. 13 and 14, viewed together, illustrate a simulation of the disclosed frequency tuning methodology in the absence of noise showing the unstable limit cycle behavior. The ideal frequency (where the error is at its minimum) is 13 MHz for the first 24 milliseconds, after which the ideal frequency changes to 14 MHz. The time spent at each frequency in the simulation is 16 microseconds.

Figure 15:
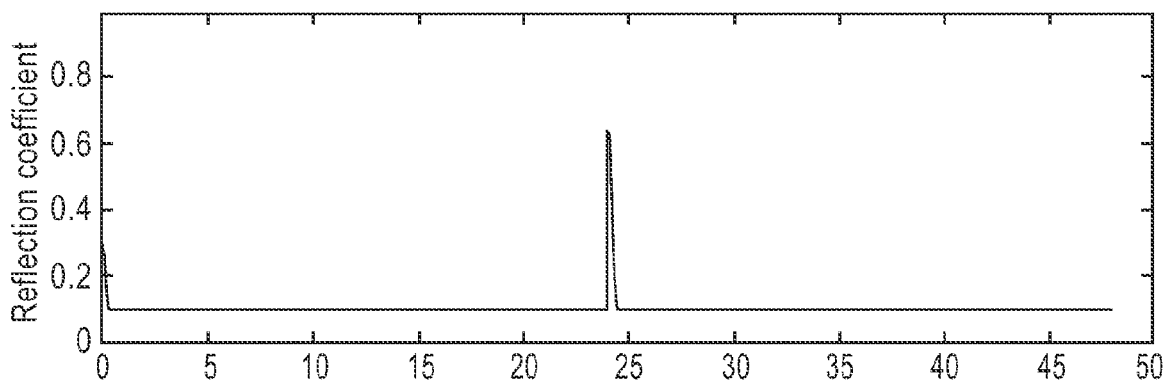
FIGS. 15 and 16 are graphs depicting a simulation of additional exemplary methods carried out in connection with embodiments in the absence of noise.
Figure 16:
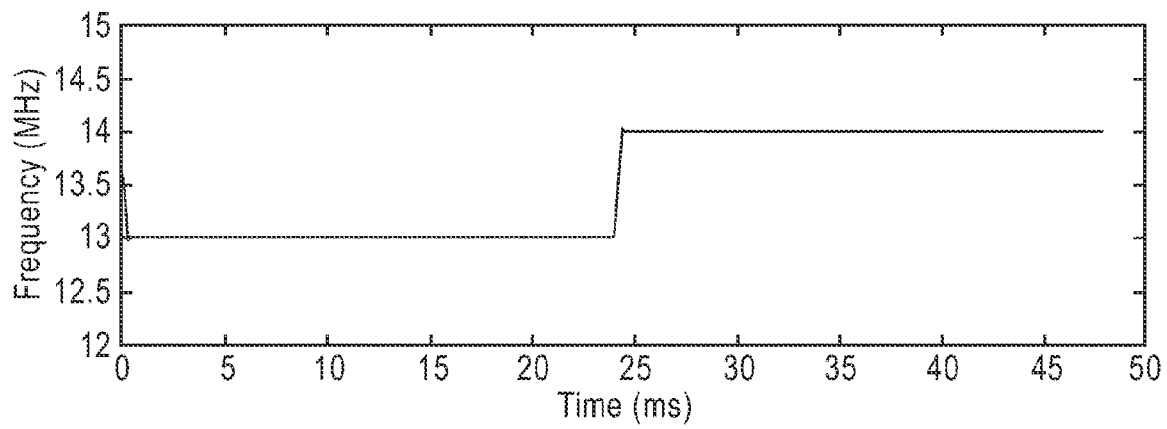

FIGS. 15 and 16, viewed together, illustrate a simulation of one variation of the disclosed frequency tuning methodology in the absence of noise, with an additional constraint that, after changing direction, the step size is only allowed to increase after $[1/(2 \times g_d)]$ steps, which enhances stability. The ideal frequency (where the error is at its minimum) is 13 MHz for the first 24 milliseconds, after which the ideal frequency changes to 14 MHz. The time spent at each frequency in the simulation is 16 microseconds.

Figure 17:
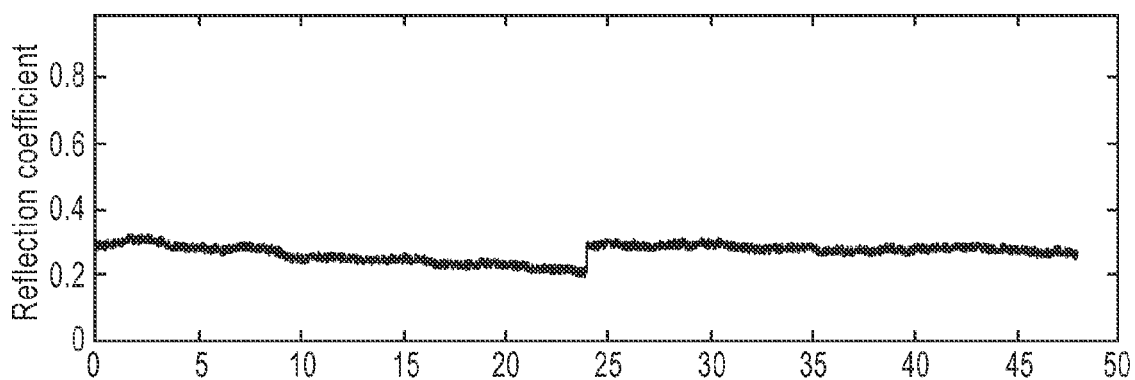
FIGS. 17 and 18 are graphs that illustrate a failure of a stabilized method to tune in the presence of noise.
Figure 18:
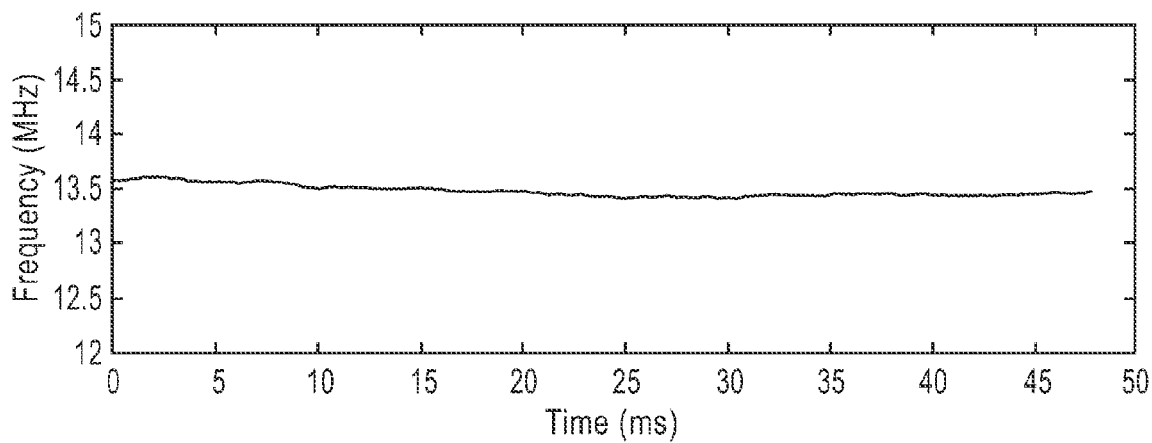

FIGS. 17 and 18, viewed together, illustrate a simulation of the disclosed frequency tuning methodology in the presence of noise, with an additional constraint that, after changing direction, the step size is only allowed to increase after $[1/(2 \times g_d)]$ steps, which enhances stability but causes it to fail to tune in the presence of noise. The ideal frequency (where the error is at its minimum) is 13 MHz for the first 24 milliseconds, after which the ideal frequency changes to 14 MHz. The time spent at each frequency in the simulation is 16 microseconds.

Figure 19:
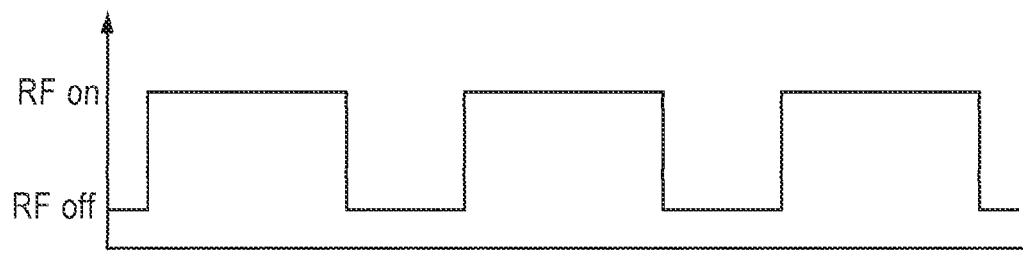
FIGS. 19, 20 and 21 are graphs that graphically illustrate inter-pulse frequency tuning in accordance with one or more embodiments of the disclosed frequency tuning method.
Figure 20:
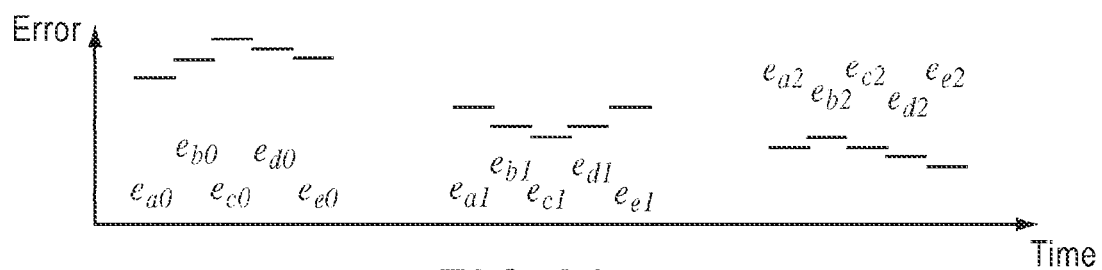
Figure 21:
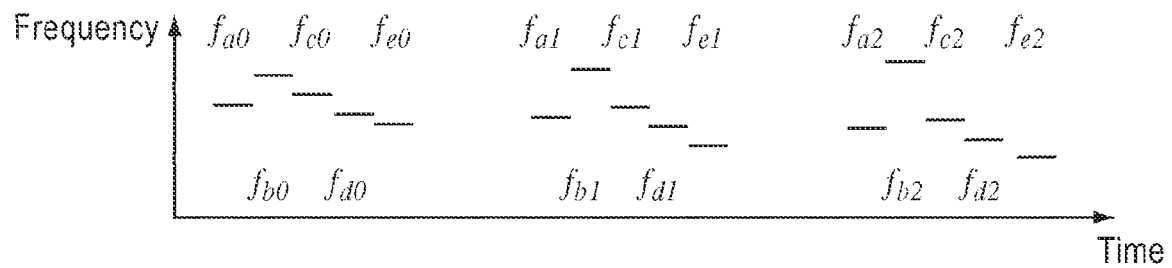

In some cases it is not possible to totally discard information at the start of a pulse, but it is undesirable to use intra-pulse information due to the danger of aliasing effects, or due to insufficient control bandwidth, or due to the risk of unstable operation due to the high bandwidth requirements placed on the frequency control system. By using memory, it is possible to design a system with similar performance to a true intra-pulse control system, but which is implemented using a lower speed stable controller controlling on inter-pulse information. Since the measurement and control cycle may be synchronized with the pulse, it is possible to use identical time slots in sequential pulses and a slower (than an intra-pulse controller) control system to control the frequency on an inter-pulse basis. Typically not only the frequency, but also other control parameters are stored and used by the control system to, for example, control delivered power to the load. Such other control parameters may include DC voltage supplied to the power devices, gate bias voltage in the case of MOSFETs (base emitter in case of bipolar devices) and RF drive level. Graphs depicting operation of an inter-pulse controled system for a high pulse repetition frequency are shown in FIGS. 19, 20 and 21. If the pulse on time becomes very long, it may be more advantageous to simply ignore information from the first few time slots, or switch to intra-pulse control at some time later in the pulse.

FIGS. 19, 20 and 21, viewed together, illustrate the disclosed inter-pulse frequency tuning. In this scheme, $f_{a2}$ is a function of only (or predominantly if adjacent time slots are also considered with some weighting) $e_{a0}$, $e_{a1}$ and $f_{a1}$. Similarly, $f_{b2}$ is a function of only (or predominantly) $e_{b0}$, $e_{b1}$ and $f_{b1}$, and so forth.

The last problem for which a solution is described is the problem of getting trapped in local non-optimal minima. Using the fact that there is a fixed time in which the plasma can operate with substantially reduced power without extinguishing, it is possible to sample and store information about operation at frequencies completely different from the current operating point. Assuming that the plasma will not extinguish if power is substantially reduced for a short enough time, T, the method works by operating, for example, 99% of the time at the optimum frequency (as determined by the frequency tuning method) and using the remaining 1% of the time in time slots not exceeding T in duration to explore operation at other frequencies.

Although many variations are possible, the following method is exemplary and illustrative. Consider operating for a time equal to 99T at the optimum frequency and then switching to a different frequency for a time of T. The entire frequency range from $f_{min}$ to $f_{max}$ can be divided into, for example, 16 equally spaced frequencies $f_0$ through $f_{15}$. The number of frequencies in which to divide the entire frequency range is a function of the known quality factor of the matching circuits employed. Sixteen is a typical number to make sure the true optimal point will not be missed in subsequent searches for the optimal frequency.

The method may start by sequentially searching $f_0$ through $f_{15}$ in the time slots of duration T to find a coarse optimum. The space may need to be searched a few times because the power control system may not be able to adjust the power correctly within the time T. Due to the nonlinear nature of the typical loads encountered, it is beneficial to measure the load reflection coefficient (or other error metric used by the method) at or close to a desired power level. By storing the control value and power level every time that a frequency is visited, the correct power level can be attained after a few visits to the same frequency.

Once the coarse optimum has been found, for example at $f_k$, where k is an integer from 0 to 15, then the method may start using the time slots of length T to find an optimum. One option is to go to $f_{16}=0.5(f_{k-1}+f_k)$ provided k>0 and $f_{17}=0.5(f_k+f_{k+1})$ provided k<15. The frequency at which the error is at a minimum between $f_{16}$, $f_k$ and $f_{17}$ then becomes the new desired frequency. The interval to the left and right of the new optimum is again split in two, and the minimum among the previous minimum and the two newly tested frequencies is selected. And when the minimum frequency happens to be $f_{min}$ or $f_{max}$, only one new frequency is generated. Due to the fact that the interval is split in half every time, the optimum frequency is found with sufficient accuracy within just a few iterations. And because the load is generally time-variant, once the optimum frequency has been found, the method generally has to start over to make sure conditions have not changed and a new global optimum has not been created.

Figure 22:
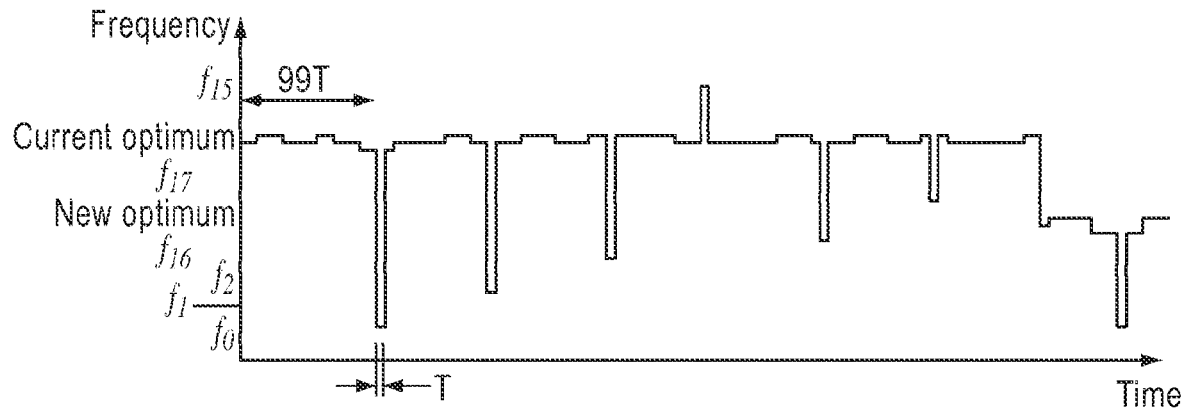
FIG. 22 graphically illustrates an exemplary frequency tuning method which uses a small percentage of time with a maximum time slot of duration T to search for a global optimum frequency.

While this method to find the global optimum is being executed, the previously described local tuning method can be run during the 99T time slot to maintain operation at the current local minimum. And staying at the current optimum frequency 99% of the time ensures that the average delivered power to the load remains virtually unchanged. FIG. 22 graphically illustrates exemplary operating characteristics that may be associated with a method which uses a small percentage of the time with a maximum time slot T to search for a global optimum frequency.

In conclusion, several embodiments of the present invention provide, among other things, a method and apparatus for dynamically tuning the operating frequency of a system comprising an electrical generator and a nonlinear and/or time varying load, such as a plasma. Those skilled in the art can readily recognize that numerous variations and substitutions may be made in embodiments of the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention as expressed in the claims.

What is claimed is:

1. A method for tuning an operating frequency of an electrical generator coupled to a time-varying load, the method comprising:
   calculating a first error at an initial operating frequency of the electrical generator, where the first error is calculated in a time frame substantially shorter than a time frame for the time-varying load to vary;
   adjusting the initial operating frequency of the electrical generator by an initial step size;
   calculating a second error where the second error is calculated in a time frame substantially shorter than the time frame for the time-varying load to vary; and
   adjusting the previously adjusted operating frequency of the electrical generator by an increased step size that is greater in magnitude than the initial step size if the magnitude of the second calculated error is smaller than the magnitude of the first calculated error.

2. The method of claim 1, further comprising adjusting the previously adjusted operating frequency of the electrical generator by a decreased step size that is smaller in magnitude than the initial step size if the magnitude of the second calculated error is greater than the magnitude of the first calculated error.

3. The method of claim 2, further comprising repeating the method of claim 2 until the electrical generator is operating at or near the frequency corresponding to minimum error.

4. The method of claim 2, further comprising:
   determining whether the calculated error is less than a lower threshold;
   stopping if the calculated error is less than the lower threshold;
   determining whether a time limit has been exceeded if the lower threshold has not been reached;
   repeating the method until either the time limit has been exceeded or the calculated error is less than the lower threshold;
   determining whether the magnitude of the calculated error is less than an upper threshold;
   stopping if the magnitude of the calculated error is less than the upper threshold; and
   repeating the method if the magnitude of the calculated error is not less than the magnitude of the upper threshold until either the calculated error is less than the upper threshold or a second time limit has been exceeded.

5. The method of claim 1, wherein calculating the first and second errors comprises using a fast division method.

6. The method of claim 5, wherein using the fast division method comprises calculating a ratio of two positive real numbers using fixed point arithmetic.

7. The method of claim 5, wherein using the fast division method further comprises:
   setting an initial low estimate of a ratio;
   setting an initial upper estimate of the ratio;
   calculating an initial middle estimate of the ratio;
   calculating a required value;
   comparing the initial middle estimate of the ratio to the required value;
   setting a new upper estimate of the ratio to the initial middle estimate if the initial middle estimate is greater than the required value, and setting a new lower estimate of the ratio to the initial middle estimate if the initial middle estimate is less than the required value; and
   repeating each action for a predetermined number of iterations.

8. The method of claim 6, wherein the fast division method further comprises using fixed point arithmetic to perform calculations.

9. The method of claim 1, wherein the electrical generator is a radio-frequency generator.

10. The method of claim 1, wherein the time-varying load includes a plasma.

11. The method of claim 1, wherein the time-varying load comprises a non-linear load.

12. An electrical generator, comprising:
   an engine including a control input configured to receive a main control signal, the main control signal controlling at least one of output power, output current, and output voltage delivered by the electrical generator, the engine being configured to generate a plurality of output powers at a plurality of frequencies to drive a time-varying impedance load;
   an impedance-measurement circuit coupled to the time-varying impedance load and to the engine, whereby the impedance-measurement circuit measures the impedance of the time-varying impedance load; and
   a frequency tuning circuit coupled to the engine and coupled to the impedance-measurement circuit configured to adjust an operating frequency of the electrical generator, the adjustment of the operating frequency being based on the measured impedance of the time-varying load, wherein the frequency tuning circuit calculates an error at the operating frequency of the generator, and wherein the frequency tuning circuit adjusts the operating frequency of the electrical generator closer to a region of minimum error.

13. The electrical generator of claim 12, wherein the frequency tuning circuit includes, for each of a plurality of discrete operational frequencies and for each of a plurality of discrete measured impedances, a lookup table mapping a corresponding region of minimum error.

14. The electrical generator of claim 12, wherein the electrical generator is a radio-frequency generator.

15. The electrical generator of claim 12, wherein the time-varying impedance load includes a plasma.

16. The electrical generator of claim 12, wherein the time-varying impedance load further comprises a non-linear load.

* * * * *